US011638358B2

(12) United States Patent
Maibrink (10) Patent No.: US 11,638,358 B2
(45) Date of Patent: Apr. 25, 2023

(54) HIGH-VOLTAGE DEVICE (71) Applicant: Robert Bosch GmbH, Stuttgart (DE)

(72) Inventor: Thomas Maibrink, St. Johann Gaechingen (DE)

(73) Assignee: Robert Bosch GmbH, Stuttgart (DE)

( * ) Notice: Subject to any disclaimer, the term of this patent is extended or adjusted under 35 U.S.C. 154(b) by 130 days.

(21) Appl. No.: 17/414,117

(22) PCT Filed: Dec. 11, 2019

(86) PCT No.: PCT/EP2019/084563
§ 371 (c)(1),
(2) Date: Jun. 15, 2021

(87) PCT Pub. No.: WO2020/126723
PCT Pub. Date: Jun. 25, 2020

(65) Prior Publication Data
US 2022/0053657 A1 Feb. 17, 2022

(30) Foreign Application Priority Data

Dec. 17, 2018 (DE) .................... 10 2018 221 907.9
Mar. 12, 2019 (DE) .................... 10 2019 203 296.6

(51) Int. Cl.
*H05K 5/02* (2006.01)
*H05K 5/03* (2006.01)
(52) U.S. Cl.
CPC ......... *H05K 5/0221* (2013.01); *H05K 5/0226* (2013.01); *H05K 5/03* (2013.01)
(58) Field of Classification Search
None
See application file for complete search history.

(56) References Cited

U.S. PATENT DOCUMENTS

2013/0099765 A1\* 4/2013 Girard .................. H02J 7/0031
323/282
2013/0301233 A1\* 11/2013 Durfee ................ H01M 50/204
361/807

(Continued)

FOREIGN PATENT DOCUMENTS

CN 104185395 A 12/2014
CN 104577552 A 4/2015

(Continued)

OTHER PUBLICATIONS

Translation of International Search Report for Application No. PCT/EP2019/084563 dated Mar. 17, 2020 (2 pages).

*Primary Examiner* — Xanthia C Cunningham
(74) *Attorney, Agent, or Firm* — Michael Best & Friedrich LLP (57) ABSTRACT

The invention relates to a high-voltage device (14) for a high-voltage application. The high-voltage dev ice comprises an electrically insulating housing (15), having a housing cover (16) that covers a housing interior (18), and covering means (10) for at least one electrical terminal (34) or electrical region to be protected from touching, which covering means are arranged in the housing interior (18). The covering means (10) have a protective cover (26). The protective cover covers the electrical terminal (34) or the electrical region, can be locked in a closed position by means of at least one locking element (30) and can be transferred into an open position by means of an opening operation. The at least one locking element (30) for the protective cover (26) within the housing is designed in such a way that the release of the at least one locking element requires a duration, the electrical terminal (34) or the electrical region having transitioned into a touching-safe state after said duration has elapsed following the opening of the (Continued)

housing cover (16) and following the interruption of the high-voltage circuit triggered by the opening of the housing cover.

6 Claims, 6 Drawing Sheets

(56) References Cited

U.S. PATENT DOCUMENTS

| | | | | |
|---|---|---|---|---|
| 2014/0193990 A1* | 7/2014 | Zhao | .................... | H01R 13/713 439/160 |
| 2015/0116875 A1* | 4/2015 | Biurrun Sotelo | ..... | H02J 7/0063 361/62 |
| 2016/0156120 A1* | 6/2016 | Ciampolini | ........ | H01R 13/7031 439/134 |
| 2018/0090859 A1* | 3/2018 | Kemnitz | .................. | B60L 53/16 |
| 2018/0323027 A1* | 11/2018 | Tomaselli | ............ | H01H 71/123 |
| 2018/0342833 A1* | 11/2018 | Yokoyama | ............. | H01R 13/42 |

FOREIGN PATENT DOCUMENTS

| | | |
|---|---|---|
| DE | 102011004625 A1 | 8/2012 |
| DE | 102014012320 B3 | 11/2015 |
| DE | 102015218573 B4 | 12/2018 |
| EP | 1026790 A1 | 8/2000 |
| EP | 3026763 A1 | 6/2016 |
| GB | 2366921 A | 3/2002 |

* cited by examiner

HIGH-VOLTAGE DEVICE

BACKGROUND

The present invention relates to a high-voltage device for a high-voltage application.

Current high-voltage systems (power electronics, high-voltage batteries, electric motors, . . . ) in the automotive sector are made safe by means of safety systems such as touch-protection measures and shut-off systems, for example.

DE 10 2014 012 320 B3 discloses a battery module, wherein the battery module comprises a housing which electrically insulates the electric pole and provides touch-protection for the screw and the electric pole.

One established system involves monitoring all detachable parts (e.g. plug and cover) by means of an electric loop and, in the event of a corresponding interruption of this monitoring loop, switching off the areas which are relevant to high-voltage safety and disconnecting them from the power supply. In many products, this takes place by means of two additional pins of an existing connector (e.g. vehicle signal connector or tap of the climate control compressor). The cover or other detachable parts have a link mechanism which prevents the detachment of the cover prior to the disconnection of the connector. This connector is therefore disconnected prior to opening the cover(s), and the discharging of the entire system takes place.

The background to the invention is that, in existing systems, an additional connector interface is needed to enable the time offset between opening the high-voltage interlock line and gaining access to the high-voltage connections. In systems which do not have an electrical interface in which high-voltage interlock monitoring can be integrated, the high-voltage safety discharge time is generally not realized or is only realized in a very laborious manner.

The object of the present invention is therefore to provide a high-voltage device with which a safe discharge time can be ensured in a simple manner in systems which do not have an electrical interface.

SUMMARY

The object is achieved by a high-voltage device according to the invention. The respective related claims describe advantageous developments of the invention.

The invention provides a high-voltage device for a high-voltage application. In this case, the high-voltage device comprises an electrically insulating housing having a housing cover which covers a housing interior and cover means, arranged in the housing interior, for at least one electrical terminal or electrical area to be protected from touch.

The cover means have a protective cover, which covers the electrical terminal or the electrical area, can be locked in a closed position by means of at least one locking element and can be transferred into an open position by means of an opening procedure, wherein the at least one locking element for the protective cover within the housing is designed in such a way that its release demands a period of time, after which the electrical terminal or the electrical area has transitioned to a touch-proof state following the opening of the housing cover and the thus-triggered interruption of the high-voltage circuit.

Within the context of the invention, the term "high-voltage", when used accordingly in the automotive sector, is understood to refer to a voltage above 60V.

In this case, a cover means is understood to be an element whereof the material, form and configuration is selected according to the protection needed. In this case, a locking element is understood to be a component which prevents direct opening. This means that, with conventional handling, the locking element must firstly be unlocked before access to the electrical terminal to be protected and/or an area is possible. In this case, the deactivation, i.e. the unlocking of the at least one locking element, generally needs a minimum time, which is necessary so that the electrical terminal no longer has to be protected.

The cover means is therefore advantageous in that, after triggering a first event, for example interrupting the power supply, after which an electrical terminal to be protected still has to be protected from touch and/or engagement for a predetermined time, this predetermined time can at least be ensured. In this case, this time is ensured by a time function which is required to unlock the at least one locking element of the cover means. Safe use for the user is thus enabled. Sufficient discharge time can thus be guaranteed in a simple manner.

In a preferred embodiment of the invention, the locking element can only be removed by a movement in a specified lateral direction and/or direction of rotation, and wherein the type, length and/or mechanical resistance of this movement are calculated such that the removal of the locking element with a specified tool kit takes as least as long as the transition to the touch-proof state. In this case, the receiver cooperates with the locking element in such a way that a certain movement or a combination of movements is needed to deactivate the locking element. By configuring the corresponding factors accordingly, it is possible to specify the time which is at least required to unlock the unlocking element. Sufficient time for discharging capacitors, for example, can thus be guaranteed.

In a further preferred embodiment of the invention, after the deactivation of all locking elements, at least part of the at least one cover means prevents the designated operation of the electrical terminal to be protected from commencing again until all locking elements are activated. For example, this means that, after deactivation, the locking elements, a locking element which is the last to be activated or another part of the cover means prevents the designated use. It is thus guaranteed that all locking elements have been activated when the operation of the device fitted with this cover means commences again, so that permanent protection can be ensured.

The cover means preferably has at least one connecting means so that the cover means can be movably fastened on the electrical terminal or in the vicinity of the electrical area. In this case, the movable connecting means enables access to the electrical terminal if this no longer has to be protected, and also enables a position in which the electrical terminal is protected from touch. In addition, the cover means is permanently arranged at a predetermined point so that it cannot become detached during normal use and cannot be misplaced.

In an advantageous development, the connecting means forms a hinge so that the protective cover is pivotably arranged. A hinge is a simple means with which the cover means can be permanently fastened at a designated point.

The locking element is advantageously arranged on the protective cover, or connected thereto, in a loss-proof manner. Within the context of the invention, "loss-proof" is understood to mean that the locking element cannot become lost during the designated use of the cover means. It is thus guaranteed that a function of the locking element can be permanently ensured. This therefore enables safe use of the cover means.

In a further advantageous embodiment, the locking element is a screw, which is held on the protective cover in the axial screw direction. In this case, a screw is a simple and cost-effective means with which both a time function and a locking function is enabled. However, other locking elements are also possible, such as snap hooks or a guide link, for which a certain amount of time is needed to unlock them.

BRIEF DESCRIPTION OF THE DRAWINGS

Exemplary embodiments of the invention are illustrated in the drawing and explained in more detail in the description below. In the drawing.

DETAILED DESCRIPTION

Figure 1:
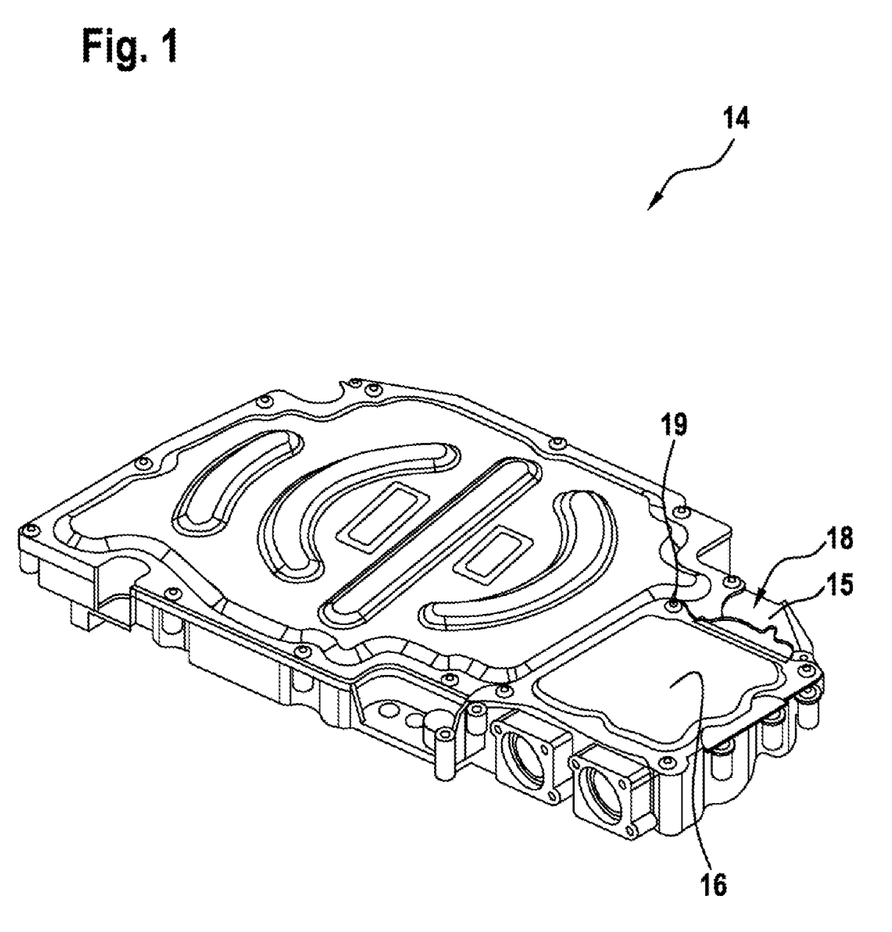
FIG. 1 shows an exemplary embodiment of a high-voltage device for operating a high-voltage application.

An exemplary embodiment of a high-voltage device 14 for operating a high-voltage application is shown in FIG. 1. The high-voltage device 14 comprises an electrically insulating housing 15 and a housing cover 16, which is still fastened on the housing 15 in this figure. The housing cover 16 covers a housing interior 18 of the electrically insulating housing 15.

Figure 2:
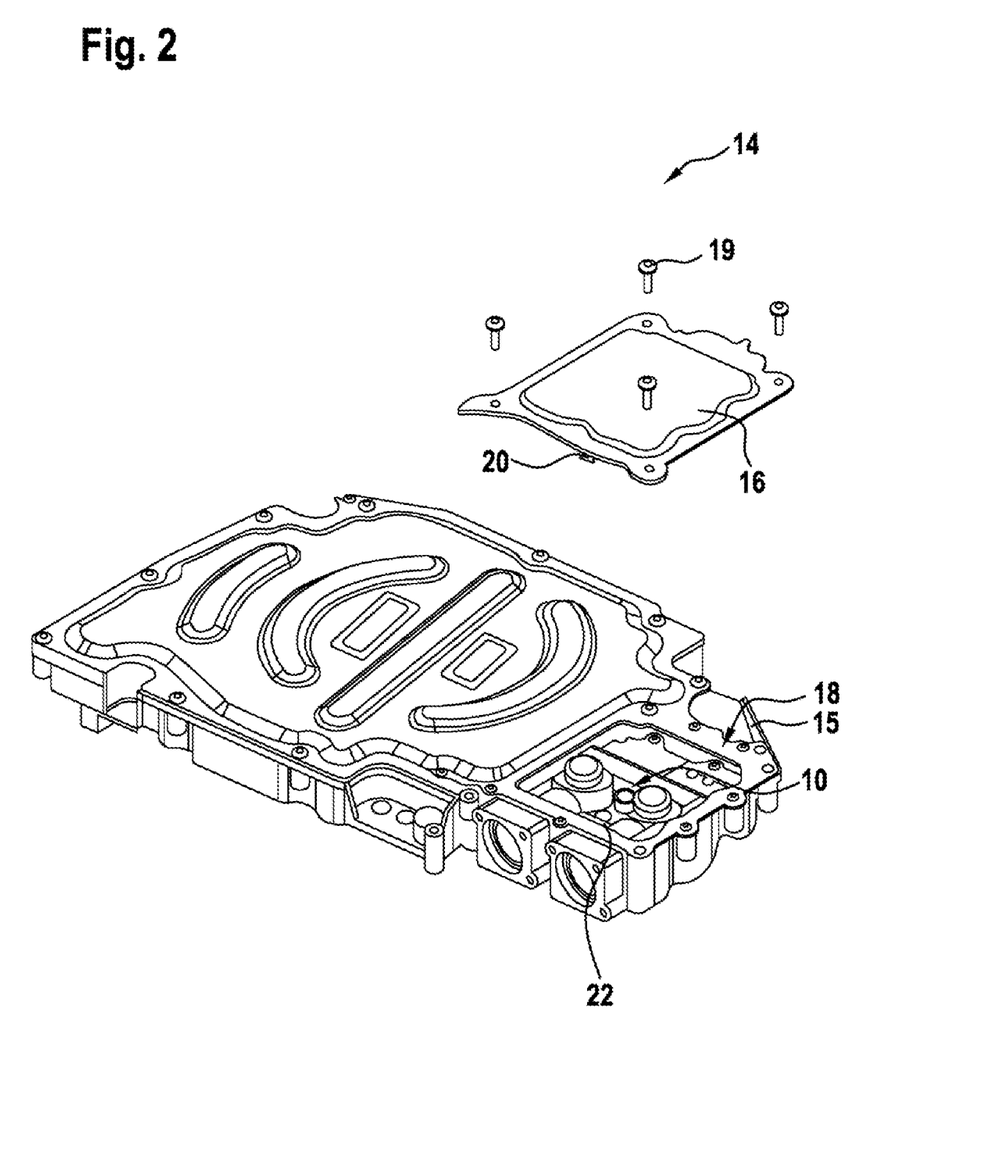
FIG. 2 shows a high-voltage device according to FIG. 1 after the release of the housing screws fastening the housing cover.

FIG. 2 shows the high-voltage device 14 after the release of the housing screws 19 fastening the housing cover 16. The housing cover 16 shown here has already been detached from the housing 15. With the detachment of the housing cover 16, a contact bridge 20, which is arranged on the back of the housing cover 16, is disconnected from a plug contact 22 in the housing interior 18 so that the plug contact 22 is opened. An electrical signal is generated via the plug contact 22 so that an electrical connection to a battery is disconnected. Capacitors (not shown) of the high-voltage device 14 are discharged as a result of breaking the electrical connection. However, the discharging of the capacitors takes a certain amount of time. A cover means 10 is provided to ensure this time.

Figure 3:
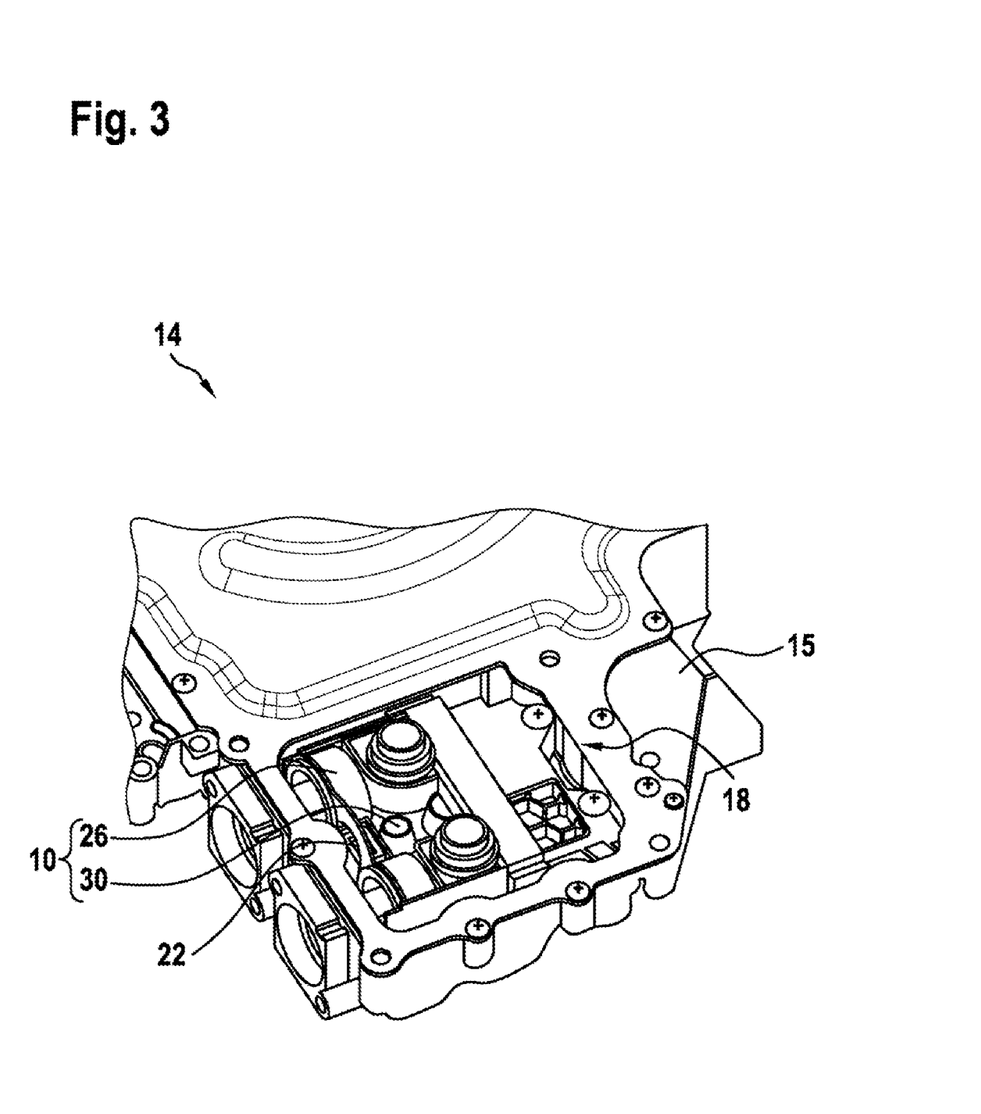
FIG. 3 shows a high-voltage device after the complete detachment of the housing cover.

FIG. 3 shows the high-voltage device 14 after the complete detachment of the housing cover 16. The cover means 10 shown in the exemplary embodiment has a protective cover 26 and a locking element 30. The locking element 30 is locked in the position of the cover means 10 which is shown in FIG. 3. In this exemplary embodiment, the locking element 30 is a screw. In this case, the screw 30 is arranged on the protective cover 26 and fastens the protective cover 26 over an electrical terminal 34 to be protected (see FIG. 4).

Figure 4:
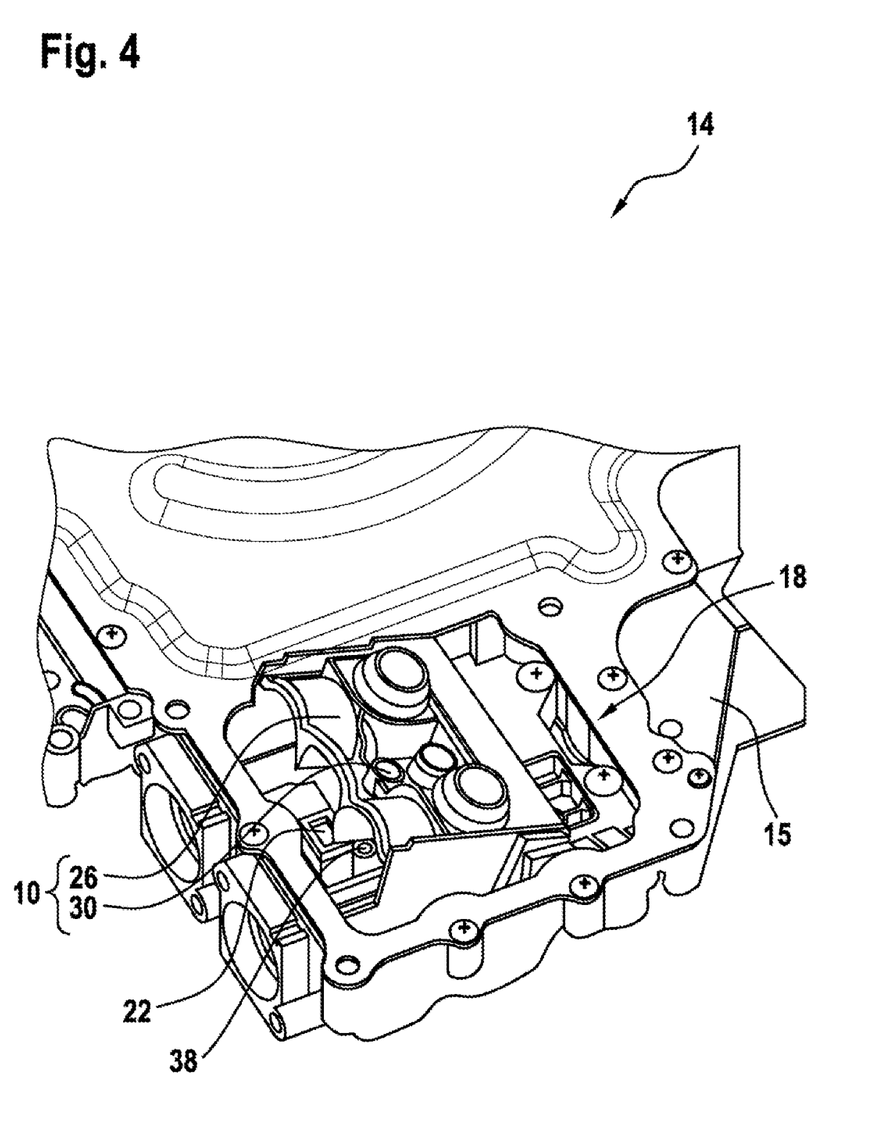
FIG. 4 shows a high-voltage device with a cover means after the release of the locking element.

The high-voltage device 14 with the cover means 10 is shown after the release of the locking element 30 in FIG. 4. In this position, the screw 30 has been unscrewed from a threaded bore 38. In this case, this screwing procedure takes at least a certain amount of time owing to the corresponding length L of the screw 30 (see FIG. 5), so that the terminal 34 to be protected, which refers to electrical contacts here, no longer has to be protected from touch. This means that, after this time, the capacitors are discharged so as to enable safe touching.

Figure 5:
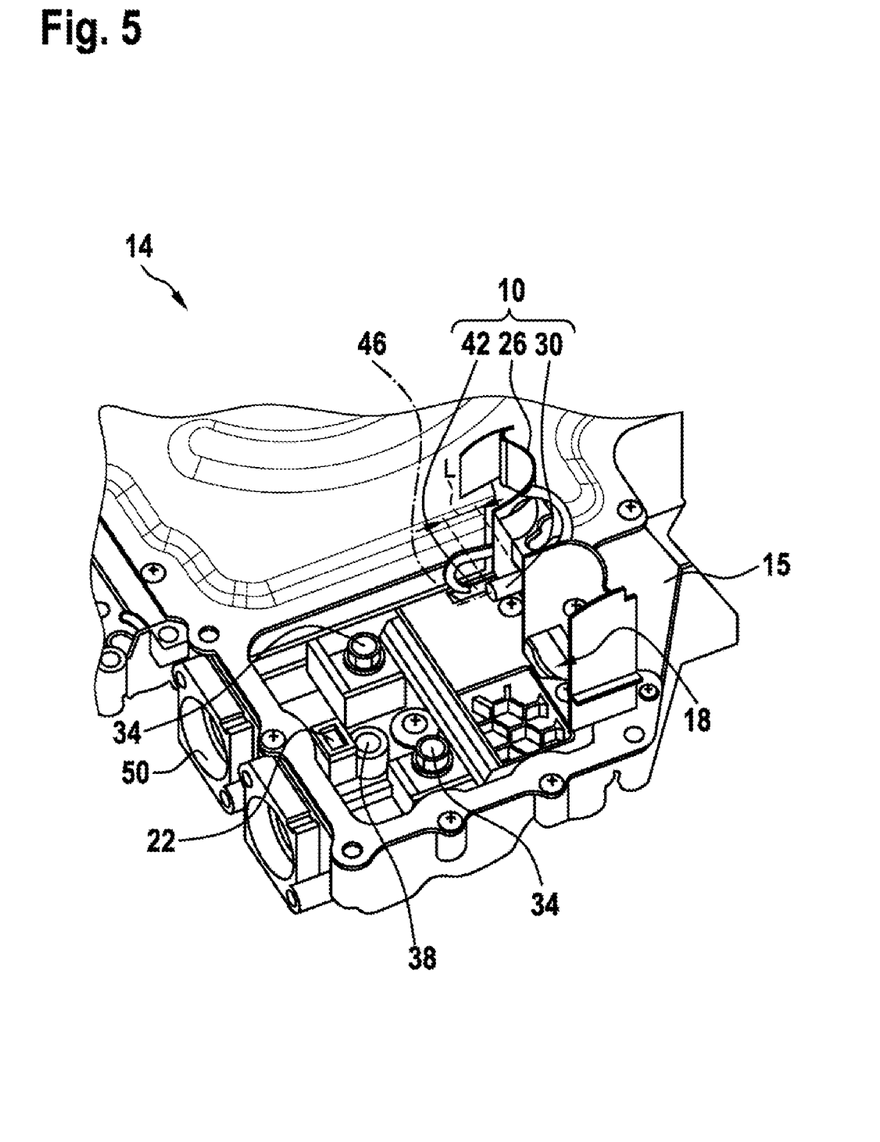
FIG. 5 shows a high-voltage device in an access position of the cover means.

The high-voltage device 14 is shown in an access position of the cover means 10 in FIG. 5. After the release of the screw 30, the protective cover 26 can be moved into the access position via a connecting means 42, which refers to hinges of the cover means 10 here. In this case, the hinges 42 are fastened in the vicinity of the electrical terminals 34, so that the protective cover 26 can be pivoted into an access position. A latching position is provided in this position, so that the access portion can be maintained. Access to the electrical terminal 34 is thus facilitated.

The screw 30 is arranged on the protective cover 26 in a loss-proof manner. This means that, upon a rotational movement, the screw 30 essentially does not execute a movement in relation to the protective cover 26 in the axial screw direction 46. In this access position, electrical lines (not shown) can be introduced into openings 50 of the housing 15 and can establish contact with the electrical terminals 34.

Figure 6:
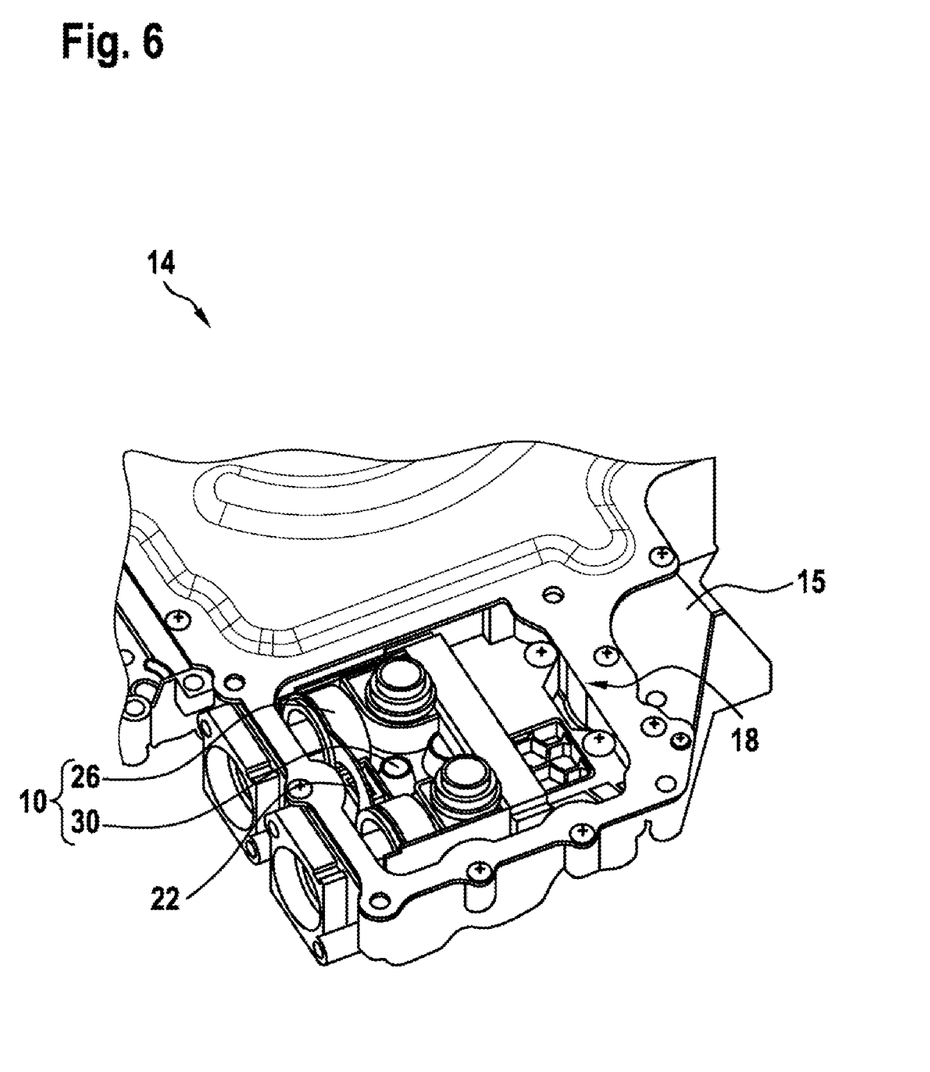
FIG. 6 shows a high-voltage device after the regular closure of the cover means.

FIG. 6 shows the high-voltage device 14 after the regular closing of the cover means 10. After the contacting of the electrical lines, the protective cover 26 can be brought back into a position in which it covers the electrical terminals 34.

If the screw 30 is not screwed in again in this position, i.e. the locking element 30 is not activated, the screw 30 rests on the threaded bore 38. The protective cover 26 is thus at a greater spacing from the electrical terminals 34 (see also FIG. 4) compared to a position in which the screw 30 is screwed in. Since the screw 30 does not execute a movement in relation to the protective cover 26 in the axial screw direction 46, this spacing here corresponds to the length L of the screw 30. As shown in FIG. 4, part of the protective cover 30 thus projects into a plane of the housing cover 16, which is mounted above the protective cover 26. This makes it impossible to assemble the high-voltage device 14 and the contact bridge 20 is therefore not brought into contact with the plug contact 22. It is thus likewise impossible for the operation of the high-voltage device 14 to commence. To enable assembly, it is therefore necessary to screw in the screw 30 and thereby activate the locking element 30.

Only once the screw 30 has been screwed in completely can the housing cover 16 be applied so that safe use can be ensured. When the housing cover 16 is mounted, the plug contact 22 is closed again via the contact bridge 20 so that the electrical connection to the battery can be established again.

What is claimed is:

1. A high-voltage device (14) for a high-voltage application, comprising an electrically insulating housing (15) having a housing cover (16) which covers a housing interior (18) and a cover unit (10), arranged in the housing interior (18), for at least one electrical terminal (34) or electrical area to be protected from touch, wherein the cover unit (10) has a protective cover (26), which covers the electrical terminal (34) or the electrical area, can be locked in a closed position by at least one locking element (30) and can be transferred into an open position by an opening procedure, wherein the at least one locking element (30) for the protective cover (26) within the housing is designed in such a way that release of the at least one locking element (30) demands a period of time, after which the electrical terminal (34) or the electrical area has transitioned to a touch-proof state following the opening of the housing cover (16) and a triggered interruption of a high-voltage circuit.

2. The high-voltage device (14) as claimed in claim 1, wherein the locking element (30) can only be removed by a movement in a specified lateral direction and/or direction of rotation, and wherein a type, length (L) and/or mechanical resistance of this movement are calculated such that the removal of the locking element (30) with a specified tool kit takes as least as long as the transition to the touch-proof state.

3. The high-voltage device (14) as claimed in claim 1, wherein the cover unit (10) has at least one connecting member (42) so that the cover unit (10) can be movably fastened on the electrical terminal (34) or in a vicinity of the electrical area (34).

4. The high-voltage device (14) as claimed in claim 3, wherein the connecting member (42) forms a hinge so that the protective cover (26) is pivotably arranged.

5. The high-voltage device (14) as claimed in claim 1, wherein the locking element (30) is arranged on the protective cover (26), or connected thereto, in a loss-proof manner.

6. The high-voltage device (14) as claimed in claim 1, wherein the locking element (30) is a screw, which is held on the protective cover (26) in an axial screw direction (46).

* * * * *